United States Patent
Koyama et al.

(10) Patent No.: US 10,668,697 B2
(45) Date of Patent: Jun. 2, 2020

(54) METHOD FOR MANUFACTURING METAL CLAD LAMINATED BOARD, METHOD FOR MANUFACTURING ELECTRONIC CIRCUIT BOARD, AND RIGID BODY PENDULUM TYPE VISCOELASTICITY MEASURING DEVICE

(71) Applicant: Panasonic Intellectual Property Management Co., Ltd., Osaka (JP)

(72) Inventors: Masaya Koyama, Mie (JP); Kiyotaka Komori, Mie (JP); Hiroaki Takahashi, Mie (JP); Yoshinori Matsuzaki, Mie (JP); Tadashi Mori, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/094,044

(22) PCT Filed: May 11, 2017

(86) PCT No.: PCT/JP2017/017792
§ 371 (c)(1),
(2) Date: Oct. 16, 2018

(87) PCT Pub. No.: WO2017/199829
PCT Pub. Date: Nov. 23, 2017

(65) Prior Publication Data
US 2019/0134951 A1    May 9, 2019

(30) Foreign Application Priority Data

May 20, 2016  (JP) ................................ 2016-101985

(51) Int. Cl.
*B32B 15/092*  (2006.01)
*B32B 15/08*   (2006.01)
(Continued)

(52) U.S. Cl.
CPC ............ *B32B 15/092* (2013.01); *B32B 15/08* (2013.01); *B32B 15/20* (2013.01); *B32B 38/18* (2013.01);
(Continued)

(58) Field of Classification Search
CPC ........ B32B 15/092; B32B 15/20; B32B 38/18
(Continued)

(56) References Cited

FOREIGN PATENT DOCUMENTS

| JP | 63-035948 U | 3/1988 |
|----|-------------|--------|
| JP | 2005-081649 | 3/2005 |

(Continued)

OTHER PUBLICATIONS

English Translation of JP2007017227 (Hatano) (Year: 2007).*
(Continued)

*Primary Examiner* — Matthew J Daniels
*Assistant Examiner* — Hana C Page
(74) *Attorney, Agent, or Firm* — Greenblum & Bernstein, P.L.C.

(57) ABSTRACT

Included are removing an outermost layer or outermost layers on one side or both sides of liquid crystal polymer film; and a molding step of performing thermocompression molding on liquid crystal polymer film and metal foil stacked on the side of liquid crystal polymer film whose outermost layer is removed. A heating temperature in the molding step is in a range from a temperature equal to a melting start temperature, of the liquid crystal polymer film, measured by using a rigid body pendulum type viscoelasticity measuring device to a temperature 60° C. higher than the melting start temperature inclusive.

14 Claims, 5 Drawing Sheets

(51) Int. Cl.
  *H05K 3/46* (2006.01)
  *B32B 38/18* (2006.01)
  *B32B 15/20* (2006.01)
  *H05K 3/38* (2006.01)
  *B32B 27/36* (2006.01)

(52) U.S. Cl.
  CPC ........... *H05K 3/381* (2013.01); *H05K 3/4632* (2013.01); *B32B 27/36* (2013.01); *B32B 2457/08* (2013.01); *H05K 2201/0141* (2013.01); *Y02E 10/50* (2013.01); *Y02P 70/521* (2015.11)

(58) Field of Classification Search
  USPC ........................................................ 156/242
  See application file for complete search history.

(56) References Cited

FOREIGN PATENT DOCUMENTS

| JP | 2008-109127 | 5/2008 |
|---|---|---|
| JP | 2010-103269 | 5/2010 |
| WO | 2011/093427 | 8/2011 |

OTHER PUBLICATIONS

Rajiv Asthana and Natalia Sobczak."Wettability, Spreading, and Interfacial Phenomena in High-Temperature Coatings." <https://www.tms.org/pubs/journals/JOM/0001/Asthana/Asthana-0001-text.html> (Year: 2000).*

RPT-3000W: Rigid-body Pendulum Type Physical Properties Testing Instrument. <http://www.aandd.jp/products/test_measuring/rpt/rpt.html> Available Nov. 8, 2012 (Year: 2012).*

Rieger. "The glass transition temperature Tg of polymers—Comparison of the values from differential thermal analysis (DTA, DSC) and dynamic mechanical measurements (torsion pendulum)," Polymer Testing 20 (2001) 199-204 (Year: 2001).*

International Search Report of PCT application No. PCT/JP2017/017792 dated Aug. 15, 2017.

* cited by examiner

METHOD FOR MANUFACTURING METAL CLAD LAMINATED BOARD, METHOD FOR MANUFACTURING ELECTRONIC CIRCUIT BOARD, AND RIGID BODY PENDULUM TYPE VISCOELASTICITY MEASURING DEVICE

This application is a U.S. national stage application of the PCT International Application No. PCT/JP2017/017792 filed on May 11, 2017, which claims the benefit of foreign priority of Japanese patent application 2016-101985 filed on May 20, 2016, the contents all of which are incorporated herein by reference.

TECHNICAL FIELD

The present invention relates to a method for manufacturing a metal clad laminated board, a method for manufacturing an electronic circuit board, and a rigid body pendulum type viscoelasticity measuring device. In more detail, the present invention relates to a method for manufacturing a metal clad laminated board, a method for manufacturing an electronic circuit board, and a rigid body pendulum type viscoelasticity measuring device that are appropriate for manufacturing a multilayer printed circuit board.

BACKGROUND ART

In recent years, safety support systems for automobiles using millimeter wave radars have been put in practical use, and electric devices used in the systems have been accordingly required to be improved in performance. As a way to make an electric device highly functionally operate, a high frequency characteristic is expected to be added to a printed circuit board. Therefore, development is being actively conducted on printed circuit boards using liquid crystal polymer having a low dielectric constant, a low dielectric dissipation factor, and a low transmission loss on a signal line.

For example, PTL 1 proposes a method for manufacturing a single-sided metal clad laminated body. In the method, a metal foil, an insulating film made of a thermoplastic liquid crystal polymer film, and a separation film are stacked and subjected to thermocompression bonding, and the separation film is then removed.

PTL 2 proposes a method for manufacturing the following liquid crystal polymer film laminated base material. First, a surface of a liquid crystal polymer film is roughened with etching liquid. Next, a base material to be laminated and the liquid crystal polymer film are stacked in a manner that the roughened surface of the film and a surface of the base material are opposed to each other. After that, a thermocompression process is performed to laminate the base material and the film into one body.

However, different from epoxy resins or polyimide resins constituting common substrates, the liquid crystal polymer film has a problem that heat resistance is low. In particular, if rigidity (for example, viscosity and elastic modulus) of a liquid crystal polymer film becomes too low due to a heating temperature at the time of thermocompression molding, air can get in and stay between the liquid crystal polymer film and a metal foil or between the liquid crystal polymer film and a single-sided metal clad laminated board, whereby adhesiveness can be reduced.

CITATION LIST

Patent Literature

PTL 1: PCT International Publication No. WO 2011/093427

PTL 2: Unexamined Japanese Patent Publication No. 2005-081649

SUMMARY

The present invention has been made in view of the above issues. An object of the present invention is to provide a method for manufacturing a metal clad laminated board, and the method can improve adhesiveness between a liquid crystal polymer film and a metal foil in the case of manufacturing metal clad laminated board including the liquid crystal polymer film. Further, an object of the present invention is to provide a method for manufacturing an electronic circuit board, and the method can improve adhesiveness between a liquid crystal polymer film and a conductor circuit in the case of manufacturing an electronic circuit board including the liquid crystal polymer film. An object of the present invention is also to provide a rigid body pendulum type viscoelasticity measuring device suitable for the methods.

A method for manufacturing a metal clad laminated board according to the present invention includes: removing an outermost layer or outermost layers on one side or both sides of a liquid crystal polymer film; and a molding step of performing thermocompression molding on the liquid crystal polymer film and a metal foil stacked on the side of the liquid crystal polymer film whose outermost layer is removed. A heating temperature in the molding step is in a range from a temperature equal to a melting start temperature, of the liquid crystal polymer film, measured by using a rigid body pendulum type viscoelasticity measuring device to a temperature 60° C. higher than the melting start temperature inclusive.

A method for manufacturing an electronic circuit board according to the present invention includes: preparing a core material having a conductor circuit formed on at least one side of the core material; preparing a single-sided metal clad laminated board configured with a first liquid crystal polymer film and a metal foil attached to one side of the first liquid crystal polymer film; preparing a bonding sheet configured with a second liquid crystal polymer film; removing outermost layers on both sides of the second liquid crystal polymer film; forming a stacked article by stacking, in order, the core material, the bonding sheet, and the single-sided metal clad laminated board in a manner that the side of the core material that the conductor circuit is formed on and one side of the bonding sheet are opposed to each other and that an other side of the bonding sheet and a side of the first liquid crystal polymer film of the single-sided metal clad laminated board are opposed to each other; and performing thermocompression molding on the stacked article. A heating temperature in the molding step is in a range from a temperature equal to a melting start temperature, of the second liquid crystal polymer film, measured by using a rigid body pendulum type viscoelasticity measuring device to a temperature 60° C. higher than the melting start temperature inclusive.

With the present invention, in the case of manufacturing a metal clad laminated board including a liquid crystal polymer film, it is possible to improve adhesiveness between the liquid crystal polymer film and a metal foil. Further, in the case of manufacturing an electronic circuit board including a liquid crystal polymer film, it is possible to improve adhesiveness between the liquid crystal polymer film and a conductor circuit.

DESCRIPTION OF PREFERRED EMBODIMENTS

[How the Present Invention has been Completed]

Figure 1A:
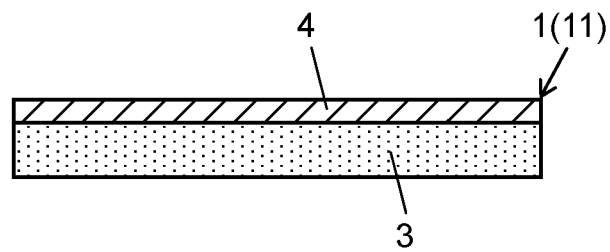
FIG. 1A is a schematic cross-sectional view showing an example of a cross-section of a single-sided metal clad laminated board of metal clad laminated boards of an exemplary embodiment.
Figure 1B:
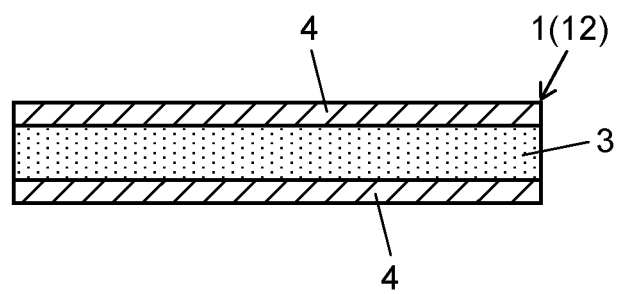
FIG. 1B is a schematic cross-sectional view showing another example of a cross-section of a double-sided metal clad laminated board of the metal clad laminated boards of the exemplary embodiment.
Figure 2A:
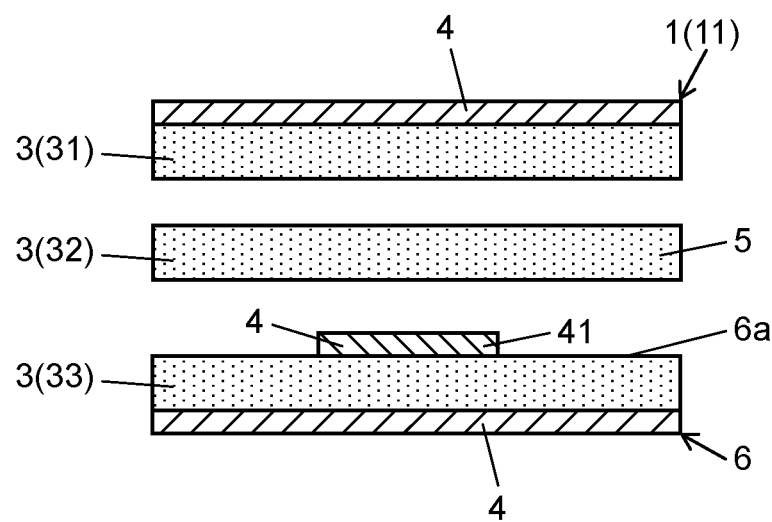
FIG. 2A is a schematic cross-sectional view showing an example of a method for manufacturing an electronic circuit board of the exemplary embodiment.
Figure 2B:
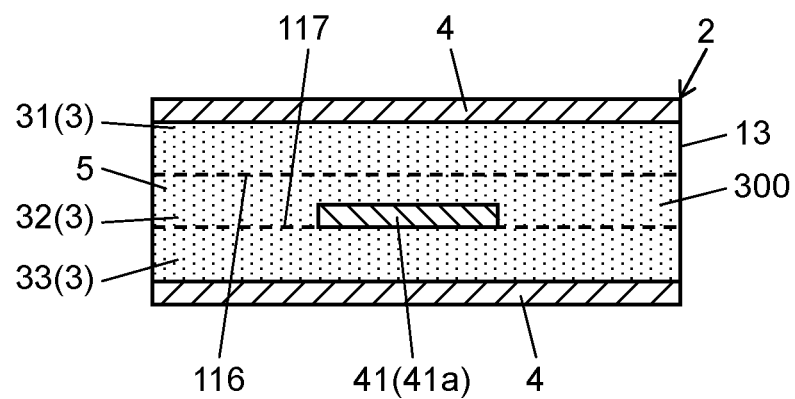
FIG. 2B is a schematic cross-sectional view showing an example of an electronic circuit board of the exemplary embodiment.

FIG. 1A is a schematic cross-sectional view showing an example of a cross-section of a single-sided metal clad laminated board of metal clad laminated boards 1 of the exemplary embodiment. FIG. 1B is a schematic cross-sectional view showing another example of a cross-section of a double-sided metal clad laminated board of metal clad laminated boards 1 of the exemplary embodiment. FIG. 2A is a schematic cross-sectional view showing an example of a method for manufacturing an electronic circuit board of the exemplary embodiment. FIG. 2B is a schematic cross-sectional view showing an example of electronic circuit board 2 of the exemplary embodiment. The inventors of the present invention have made an intensive study to improve adhesiveness in metal clad laminated boards 1 shown in FIG. 1A and FIG. 1B and electronic circuit board 2 shown in FIG. 2B. From a result of this study, the inventors of the present invention have found that the adhesiveness is influenced by a melting start temperature of liquid crystal polymer film 3 used in metal clad laminated boards 1 and electronic circuit board 2.

However, it can be thought that manufacturing conditions depend on physical properties of liquid crystal polymer film 3 or that a type of usable liquid crystal polymer film 3 is limited depending on manufacturing conditions. Well-known liquid crystal polymer film 3 is formed into a thin film. Therefore, in the conventional manufacturing method, it is difficult to previously measure the melting start temperature of liquid crystal polymer film 3 usable for metal clad laminated board 1 and electronic circuit board 2. Further, it is required to improve productivity by reducing the above-mentioned influence of the manufacturing conditions and the type of liquid crystal polymer film 3.

The inventors of the present invention further continued to study on the basis of the above result of the study also in view of the above issues, and as a result, the inventors have conceived the present invention.

[Metal Clad Laminated Board]

Hereinafter, an exemplary embodiment of the present invention will be described.

Metal clad laminated board 1 includes liquid crystal polymer film 3 and metal foils 4. With reference to FIG. 1A, metal clad laminated board 1 represents single-sided metal clad laminated board 11. Single-sided metal clad laminated board 11 is provided with metal foil 4 on one side of liquid crystal polymer film 3. With reference to FIG. 1B, metal clad laminated board 1 represents double-sided metal clad laminated board 12. Double-sided metal clad laminated board 12 is provided with metal foils 4 on both sides of liquid crystal polymer film 3.

Metal foil 4 and liquid crystal polymer film 3 will be described below.

Examples of metal foil 4 include a copper foil, a stainless steel foil, a nickel foil, and a nichrome foil. At least one side of metal foil 4 preferably has a matte surface. In this case, metal foil 4 may have a matte surface on one side and a shiny surface on the other side, or may have matte surfaces on the both sides. The matte surface is a surface on which fine concavities and convexities are formed. The shiny surface is a smooth surface. A thickness of metal foil 4 is, for example, between 5.0 μm and 70.0 μm inclusive.

Liquid crystal polymer film 3 is made of liquid crystal polymer (LCP) and is formed in a film shape. Examples of the liquid crystal polymer include polyarylate-based liquid crystal polymer, wholly aromatic polyester, semi-rigid aromatic polyester, and polyester amide. In addition, examples of the liquid crystal polymer include copolymer made of (1) aromatic or aliphatic dihydroxy compound, (2) aromatic or aliphatic dicarboxylic acid, (3) aromatic hydroxycarboxylic acid, or (4) aromatic diamine, aromatic hydroxyamine, or aromatic aminocarboxylic acid, as raw materials. A melting point of liquid crystal polymer film 3 can be measured by differential scanning calorimetry (DSC). The melting point of liquid crystal polymer film 3 is, for example, between 250° C. and 370° C. inclusive. A thickness of liquid crystal polymer film 3 is, for example, between 12 μm and 200 μm inclusive. Liquid crystal polymer film 3 has generally higher heat resistance and lower fluidity (viscoelasticity) than resin films, which are generally thought less likely to form a liquid crystal structure. Liquid crystal polymer film 3 includes quasicrystal parts and crystal parts. Therefore, it is thought that a ratio between the quasicrystal parts and the crystal parts contributes to the high heat resistance and the low viscoelasticity of liquid crystal polymer film 3. However, the ratio of the crystal parts to liquid crystal polymer film 3 is influenced by a molding condition when liquid crystal polymer film 3 is formed into a film shape.

Liquid crystal polymer film 3 has an outermost layer having different thermal characteristics from an inner layer. The outermost layer is a submicron level layer. The outermost layer has a higher melting start temperature than the inner layer and has different quality from the inner layer in liquid crystal polymer film 3. Therefore, in the case where a metal clad laminated board is manufactured by bonding a metal foil without removing the outermost layer, if a solder heat resistance test is conducted on the metal clad laminated board, a crack is created between the outermost layer and the inner layer by the thermal shock, and a blister is thus created.

Note that the expression "the liquid crystal polymer layer as the outermost layer" is used in some cases in the following description, and this expression has the same meaning as "the outermost layer".

Therefore, in the present exemplary embodiment, before liquid crystal polymer film 3 is used, the outermost layer is removed. The melting start temperature of liquid crystal polymer film 3 whose outermost layer is removed is previously measured.

Figure 5:
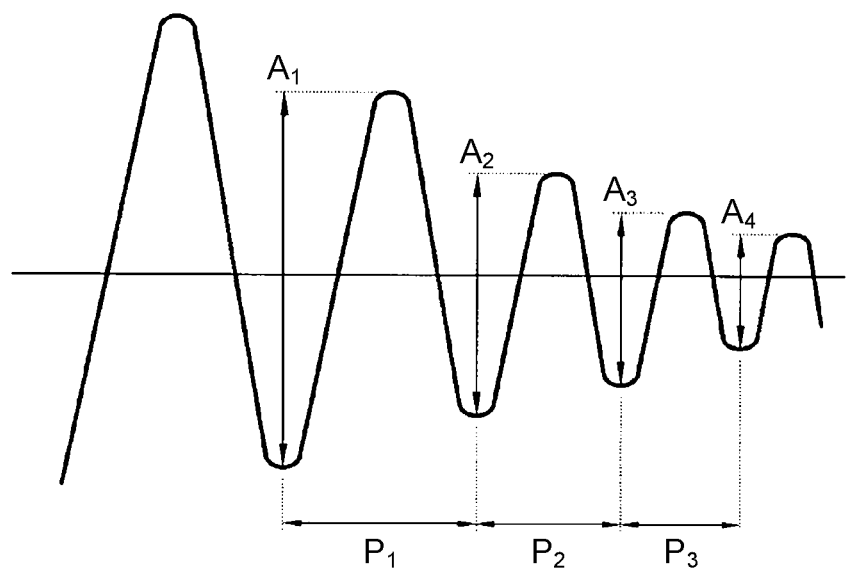
FIG. 5 is a diagram showing an example of a damping curve of an oscillation of the pendulum in the exemplary embodiment.
Figure 6:
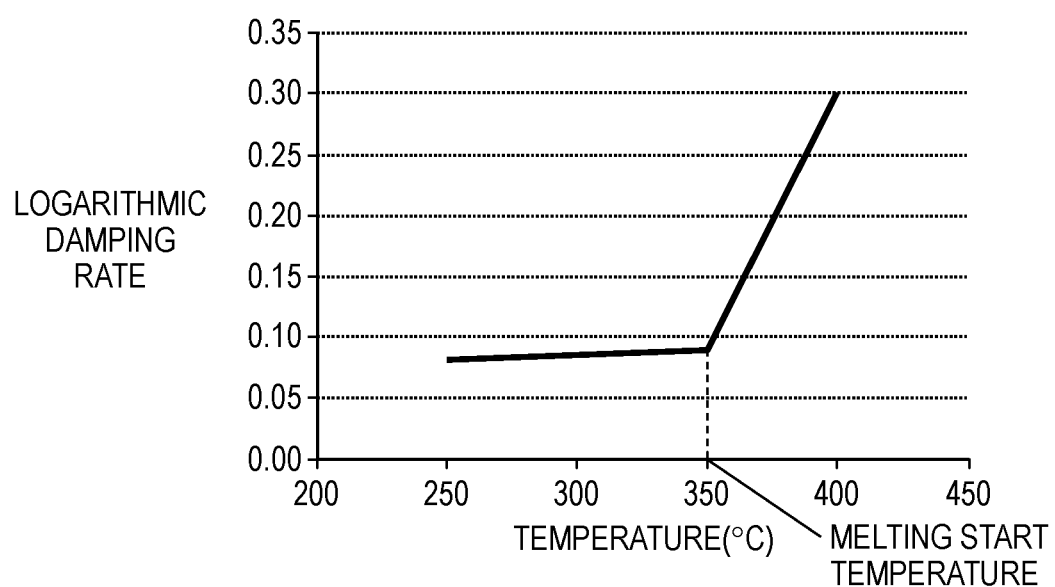
FIG. 6 is a graph showing an example of how a melting start temperature is calculated from a logarithmic damping rate of a liquid crystal polymer film in the exemplary embodiment.

FIG. 5 is a diagram showing an example of a damping curve of an oscillation of a pendulum of below-described rigid body pendulum type viscoelasticity measuring device 7 in the exemplary embodiment. FIG. 6 is a graph showing an example of how the melting start temperature is calculated from a logarithmic damping rate of a liquid crystal polymer film in the exemplary embodiment. The melting start temperature of liquid crystal polymer film 3 can be measured by using below-described rigid body pendulum type viscoelasticity measuring device 7. The melting start temperature of liquid crystal polymer film 3 can be measured as shown in FIG. 5 and FIG. 6 on the basis of the logarithmic damping rate obtained by using rigid body pendulum type viscoelasticity measuring device 7.

[Method for Manufacturing Metal Clad Laminated Board]

An example of a method for manufacturing metal clad laminated board 1 will be described below.

First, the outermost layer or layers on one side or both sides of liquid crystal polymer film 3 are removed. Next, the melting start temperature of liquid crystal polymer film 3 whose outermost layer is removed is measured on the basis of the result of the logarithmic damping rate. In the next molding step, thermocompression molding is performed with metal foil 4 stacked on the side of liquid crystal polymer film 3 whose outermost layer is removed. A heating temperature in the molding step is in a range from a temperature equal to the melting start temperature of liquid crystal polymer film 3 to a temperature 60° C. higher than the melting start temperature inclusive. If the heating is performed in this temperature range, liquid crystal polymer film 3 and metal foil 4 can be firmly made into one body.

Note that the melting start temperature of liquid crystal polymer film 3 is sometimes the same and sometimes different between one side and the other side of liquid crystal polymer film 3. In the case of manufacturing double-sided metal clad laminated board 12, the outermost layers of the both sides of liquid crystal polymer film 3 are removed. The heating temperature in the molding step needs to satisfy a condition of the above temperature range with respect to the melting start temperatures of the both sides of liquid crystal polymer film 3 whose outermost layers are removed.

If the heating temperature in the molding step is equal to or higher than the melting start temperature, the surface of liquid crystal polymer film 3 is melted at the time of molding. Thus, melted liquid crystal polymer film 3 can entirely fill the roughened surface of metal foil 4 stacked on this surface. As a result, the adhesiveness between metal foil 4 and liquid crystal polymer film 3 can be easily increased.

In contrast, if the heating temperature in the molding step is lower than the melting start temperature, the surface of liquid crystal polymer film 3 is not melted. Therefore, liquid crystal polymer film 3 cannot entirely fill the roughened surface of metal foil 4. Therefore, an anchor effect cannot be achieved between metal foil 4 and liquid crystal polymer film 3. As a result, the adhesiveness between metal foil 4 and liquid crystal polymer film 3 cannot be easily increased.

After the melting start temperature is measured on liquid crystal polymer film 3 whose outermost layer or outermost layers on the one side or the both sides are removed, metal foil 4 is stacked on the side of liquid crystal polymer film 3 whose outermost layer is removed. In this step, a side, of metal foil 4, to be stacked on liquid crystal polymer film 3 is preferably a matte surface.

As a process of removing the liquid crystal polymer layer as the outermost layer, a polishing process can be used as a simple process. The liquid crystal polymer layer as the outermost layer is removed by using a polishing material such as a polishing sheet, a polishing cloth, or a polishing roll by a thickness of from 0.1 μm to sub-micron inclusive, preferably from 0.1 μm to 1.0 μm inclusive. By removing the outermost layer, it is possible to expose the inner layer having different thermal characteristics from the outermost layer. Thus, the inner layer can firmly adhere liquid crystal polymer film 3 and metal foil 4 to each other.

In the molding step, thermocompression molding is performed for a predetermined time on liquid crystal polymer film 3 and metal foil 4 stacked on liquid crystal polymer film 3. Thermocompression molding is performed on liquid crystal polymer film 3 and metal foil 4 stacked on the side of liquid crystal polymer film 3 whose outermost layer is removed. The molding step may be a continuous process or may be a sheet-by-sheet process. In the continuous process, liquid crystal polymer film 3 and metal foil 4 are formed in a long size, and the thermocompression molding is performed on liquid crystal polymer film 3 and metal foil 4 being conveyed in a longitudinal direction. In the sheet-by-sheet process, liquid crystal polymer film 3 and metal foil 4 are each cut into pieces in the same predetermined size to make one set, and the thermocompression molding is performed on a plurality of the sets one by one. Conditions of the thermocompression molding in the molding step are, for example, between 250° C. and 350° C. inclusive, between 0.5 MPa and 6 MPa inclusive, and between 1 minute and 120 minutes inclusive. By the thermocompression molding, liquid crystal polymer film 3 is heated from the side of metal foil 4. By being heated as described above, a part of liquid crystal polymer film 3 opposed to metal foil 4 is softened. Softened liquid crystal polymer film 3 is adhered to metal foil 4. After that, the thermocompression molding is stopped, and cooling is then performed if necessary. Thus, softened liquid crystal polymer film 3 is solidified and becomes one body with metal foil 4. In this manner, single-sided metal clad laminated board 11 as shown in FIG. 1A or double-sided metal clad laminated board 12 as shown in FIG. 1B is obtained as metal clad laminated board 1. Regarding thus obtained metal clad laminated board 1, the heating temperature in the molding step is equal to or higher than the melting start temperature of liquid crystal polymer film 3 before metal foil 4 is provided. Therefore, it is easy to increase the adhesiveness between liquid crystal polymer film 3 and metal foil 4. Further, if the side, of metal foil 4, stacked on liquid crystal polymer film 3 is a matte surface, an anchor effect can further increase sticking force between metal foil 4 and liquid crystal polymer film 3.

Note that liquid crystal polymer film 3 has the outermost layer having a different thermal characteristic from the inner layer. The outermost layer is in a layer shape at submicron level. The outermost layer has a higher melting start temperature than the inner layer; therefore, layers having different qualities are in liquid crystal polymer film 3. Therefore, in the case where thermocompression molding is performed on liquid crystal polymer film 3 and metal foil 4 stacked on liquid crystal polymer film 3 whose outermost layer is not removed, and then, a solder heat resistance test is conducted on metal clad laminated board 1, a crack is created between the outermost layer and inner layer due to the thermal shock, thereby creating a blister.

When the outermost layers on the both sides of liquid crystal polymer film 3 are removed, it is preferable to measure the melting start temperatures of the both sides of liquid crystal polymer film 3. In this step, it should be confirmed that the difference between the measurement values of the melting start temperatures obtained from the both sides of liquid crystal polymer film 3 is equal to or smaller than 10° C. If the difference between the melting start temperatures obtained from the both sides of liquid crystal polymer film 3 is equal to or smaller than 10° C., it means that the outermost layers of liquid crystal polymer film 3 have been removed; therefore, the inner layer is exposed. If the difference between the melting start temperatures obtained from the both sides of liquid crystal polymer film 3 is greater than 10° C., it is preferable to repeat the removing of the outermost layers until the difference becomes equal to or smaller than 10° C.

[Electronic Circuit Board]

FIG. 2B is a schematic cross-sectional view showing an example of electronic circuit board 2 of the exemplary embodiment. Electronic circuit board 2 includes liquid crystal polymer films 3 and conductor circuit 41. In electronic circuit board 2, at least two liquid crystal polymer films 3 are stacked. In the case of electronic circuit board 2 shown in FIG. 2B, three liquid crystal polymer films 3 are stacked; however, electronic circuit board 2 does not have to have three liquid crystal polymer films 3.

Liquid crystal polymer films 3 include first liquid crystal polymer film 31, second liquid crystal polymer film 32, and third liquid crystal polymer film 33. In the example of FIG. 2B, second liquid crystal polymer film 32 is adjacent to first liquid crystal polymer film 31 and third liquid crystal polymer film 33. Conductor circuit 41 is provided between adjoining second liquid crystal polymer film 32 and third liquid crystal polymer film 33.

With reference to FIG. 2A and FIG. 2B, an example of a method for manufacturing electronic circuit board 2 of the present exemplary embodiment will be described.

First, a description will be given on single-sided metal clad laminated board 11, bonding sheet 5, and core material 6 to be used to manufacture electronic circuit board 2.

It is possible to use single-sided metal clad laminated board 11 similar to the single-sided metal clad laminated board shown in FIG. 1A. Liquid crystal polymer film 3 of single-sided metal clad laminated board 11 functions as first liquid crystal polymer film 31.

Bonding sheet 5 is second liquid crystal polymer film 32 made of the same material as the material of liquid crystal polymer film 3. A thickness of bonding sheet 5 is, for example, between 25 μm and 200 μm inclusive.

The melting start temperature of second liquid crystal polymer film 32 is measured by using a rigid body pendulum type viscoelasticity measuring device (to be described later), in a similar manner to liquid crystal polymer film 3. With respect to second liquid crystal polymer film 32, the heating temperature in the molding step is in a range from a temperature equal to the melting start temperature to a temperature 60° C. higher than the melting start temperature inclusive. In the molding step, thermocompression molding is performed on a stack of single-sided metal clad laminated board 11, core material 6, and bonding sheet 5 inserted between single-sided metal clad laminated board 11 and core material 6.

If the heating temperature in the molding step is in a range from the same temperature as the melting start temperature to the temperature 60° C. higher than the melting start temperature inclusive, second liquid crystal polymer film 32 hardly becomes entirely fluid, and a part of second liquid crystal polymer film 32 can be softened. Thus, it is easy to increase the adhesiveness between single-sided metal clad laminated board 11 and bonding sheet 5 and the adhesiveness between bonding sheet 5 and core material 6.

In contrast, in the case where the heating temperature in the molding step is lower than the melting start temperature, second liquid crystal polymer film 32 hardly becomes fluid, bonding sheet 5 cannot entirely fill concavities and convexities of the surfaces of single-sided metal clad laminated board 11 and core material 6. Therefore, bubbles are likely to remain between single-sided metal clad laminated board 11 and bonding sheet 5 and between bonding sheet 5 and core material 6. As a result, the adhesiveness in electronic circuit board 2 is not easily increased. In the case where the heating temperature in the molding step exceeds the temperature 60° C. higher than the melting start temperature, second liquid crystal polymer film 32 is too fluid, and second liquid crystal polymer film 32 may get out from end faces of electronic circuit board 2, or a thickness of second liquid crystal polymer film 32 cannot be left.

Note that in the case of manufacturing electronic circuit board 2 without previously checking the melting start temperature of second liquid crystal polymer film 32, the heating temperature in the molding step can deviate from the above range. In this case, the adhesiveness related to second liquid crystal polymer film 32 of electronic circuit board 2 can be reduced.

It is preferable to remove the liquid crystal polymer layer as the outermost layer of second liquid crystal polymer film 32. Thus, the inner layer of second liquid crystal polymer film 32 can be exposed. Therefore, the inner layer can firmly adhere the metal foils and the conductor circuit. Regarding removal of the liquid crystal polymer layer as the outermost layer, examples of a simple process include a polishing process using a polishing material such as a polishing sheet, a polishing cloth, and a polishing roll. By removing the liquid crystal polymer layer as the outermost layer, it is possible to easily increase the adhesiveness in electronic circuit board 2, in particular, the adhesiveness between second liquid crystal polymer film 32 and single-sided metal clad laminated board 11 and the adhesiveness between second liquid crystal polymer film 32 and core material 6. The liquid crystal polymer layers as the outermost layers of second liquid crystal polymer film 32 are removed by using a polishing roll by a thickness of from 0.1 μm to sub-micron inclusive, preferably from 0.1 μm to 1.0 μm inclusive. By removing the outermost layers on the both sides of second liquid crystal polymer film 32, it is possible to expose, on the both sides, the inner layer having different thermal characteristics from the outermost layer. Therefore, first liquid crystal polymer film 31 and third liquid crystal polymer film 33 can be firmly adhered to the both sides of the inner layer of second liquid crystal polymer film 32.

Core material 6 may be made of double-sided metal clad laminated board 12 shown in FIG. 1B. In the case where core material 6 is made of double-sided metal clad laminated board 12, liquid crystal polymer film 3 of double-sided metal clad laminated board 12 functions as third liquid crystal polymer film 33. By removing unnecessary parts of metal foil 4 on one side of double-sided metal clad laminated board 12 by etching, conductor circuit 41 as shown in FIG. 2A can be provided on core material 6. Conductor circuit 41 does not particularly have to be provided. However, in the following, a case will be described where conductor circuit 41 is provided on one side of core material 6 and metal foil 4 is provided on the entire surface of the other side. The one side of core material 6 on which conductor circuit 41 is provided is rough surface 6a. At the time of manufacturing core material 6, the unnecessary parts of metal foil 4 is removed by etching to expose a part of third liquid crystal polymer film 33. In this manner, parts of exposed third liquid crystal polymer film 33 are rough surface 6a to which a shape of matte surface of metal foil 4 is transferred. If rough surface 6a is provided on core material 6, the adhesiveness of core material 6 to bonding sheet 5 can be further increased when electronic circuit board 2 is manufactured. A thickness of core material 6 is, for example, between 12 μm and 200 μm inclusive. Thicknesses of conductor circuit 41 and metal foil 4 are, for example, between 5 μm and 70 μm inclusive.

As a modified example of core material 6, a resin layer formed to include, for example, epoxy resin or polyimide resin may be used instead of third liquid crystal polymer film 33. In this case, instead of liquid crystal polymer film 3, a resin layer may be used also for double-sided metal clad laminated board 12. In this manner, except using the resin layer instead of third liquid crystal polymer film 33 (liquid crystal polymer film 3), core material 6 and double-sided metal clad laminated board 12 can be formed as described above.

[Method for Manufacturing Electronic Circuit Board]

A specific method for manufacturing electronic circuit board 2 will be described below.

First, as shown in FIG. 2A, core material 6, bonding sheet 5, and single-sided metal clad laminated board 11 are stacked in this order. In this step, one side (including rough surface 6a) of core material 6 on which conductor circuit 41 formed is stacked on one side of bonding sheet 5. First liquid crystal polymer film 31 of single-sided metal clad laminated board 11 is stacked on the other side of bonding sheet 5.

By stacking core material 6, bonding sheet 5, and single-sided metal clad laminated board 11, stacked article 13 is manufactured. In the molding step, thermocompression molding is performed on stacked article 13 for a predetermined time. The molding step may be a continuous process or may be a sheet-by-sheet process. In the continuous process, core material 6, bonding sheet 5, and single-sided metal clad laminated board 11 are each formed in a long size, and the thermocompression molding is performed while core material 6, bonding sheet 5, and single-sided metal clad laminated board 11 are being conveyed in a longitudinal direction. In the sheet-by-sheet process, core material 6, bonding sheet 5, and single-sided metal clad laminated board 11 are each cut into pieces in the same predetermined size to make one set, and the thermocompression molding is performed on a plurality of the sets one by one. Conditions in the molding step are, for example, between 250° C. and 350° C. inclusive, between 0.5 MPa and 6 MPa inclusive, and between 1 minute and 120 minutes inclusive. In the step of performing thermocompression molding on stacked article 13, the heating temperature may be lower than the heating temperature in the process of manufacturing metal clad laminated board 1.

The heating temperature in the molding step is in a range from a temperature equal to a melting start temperature, of the second liquid crystal polymer film, measured by using a rigid body pendulum type viscoelasticity measuring device (to be described later) to a temperature 60° C. higher than the melting start temperature inclusive. In this case, when stacked article 13 is subjected to thermocompression molding, a part of second liquid crystal polymer film 32 easily becomes soft. A part of second liquid crystal polymer film 32 is opposed to first liquid crystal polymer film 31 and third liquid crystal polymer film 33. Thus, single-sided metal clad laminated board 11 and bonding sheet 5 are adhered to each other, and bonding sheet 5 and core material 6 are adhered to each other. After that, the thermocompression molding is stopped and cooling is performed if necessary; thus, at least softened second liquid crystal polymer film 32 is solidified, and single-sided metal clad laminated board 11, bonding sheet 5, and core material 6 become one body. Thus, electronic circuit board 2 (for example, three-layer board) as shown in FIG. 2B is obtained. After stacked article 13 is subjected to thermocompression molding, first liquid crystal polymer film 31, second liquid crystal polymer film 32, and third liquid crystal polymer film 33 are adhered into one body to become insulating layer 300. Conductor circuit 41 of core material 6 is disposed inside insulating layer 300 and becomes inner layer circuit 41a.

In electronic circuit board 2 obtained in the above manner, the surfaces of second liquid crystal polymer film 32 of bonding sheet 5 may be formed smooth. The surfaces of second liquid crystal polymer film 32 of bonding sheet 5 are preferably rough surfaces. If the surfaces are rough, it is possible to increase the adhesiveness between bonding sheet 5 and single-sided metal clad laminated board 11 and the adhesiveness between bonding sheet 5 and core material 6. If core material 6 has a roughened surface (rough surface 6a), rough surface 6a can further increase the adhesiveness between bonding sheet 5 and core material 6. Thus, sufficient adhesion is secured on boundary surface 116 between single-sided metal clad laminated board 11 and bonding sheet 5 and boundary surface 117 between bonding sheet 5 and core material 6; therefore, separation between layers can be prevented or reduced.

Electronic circuit board 2 of the present exemplary embodiment has strong sticking force on boundary surface 116 and boundary surface 117, and separation between layers can thus be prevented or reduced. In addition, in electronic circuit board 2 of the present exemplary embodiment, since first liquid crystal polymer film 31, second liquid crystal polymer film 32, and third liquid crystal polymer film 33 are adhered to form insulating layer 300, electronic circuit board 2 is excellent in a high frequency characteristic. Therefore, electronic circuit board 2 of the present exemplary embodiment can be preferably used for high-speed transmission devices such as a smartphone, a tablet personal computer (PC), a note PC, a network server device, a digital camera, a video camera, and an in-vehicle device.

[Rigid Body Pendulum Type Viscoelasticity Measuring Device]

Rigid body pendulum type viscoelasticity measuring device 7 will be described with reference to FIG. 3.

Figure 3:
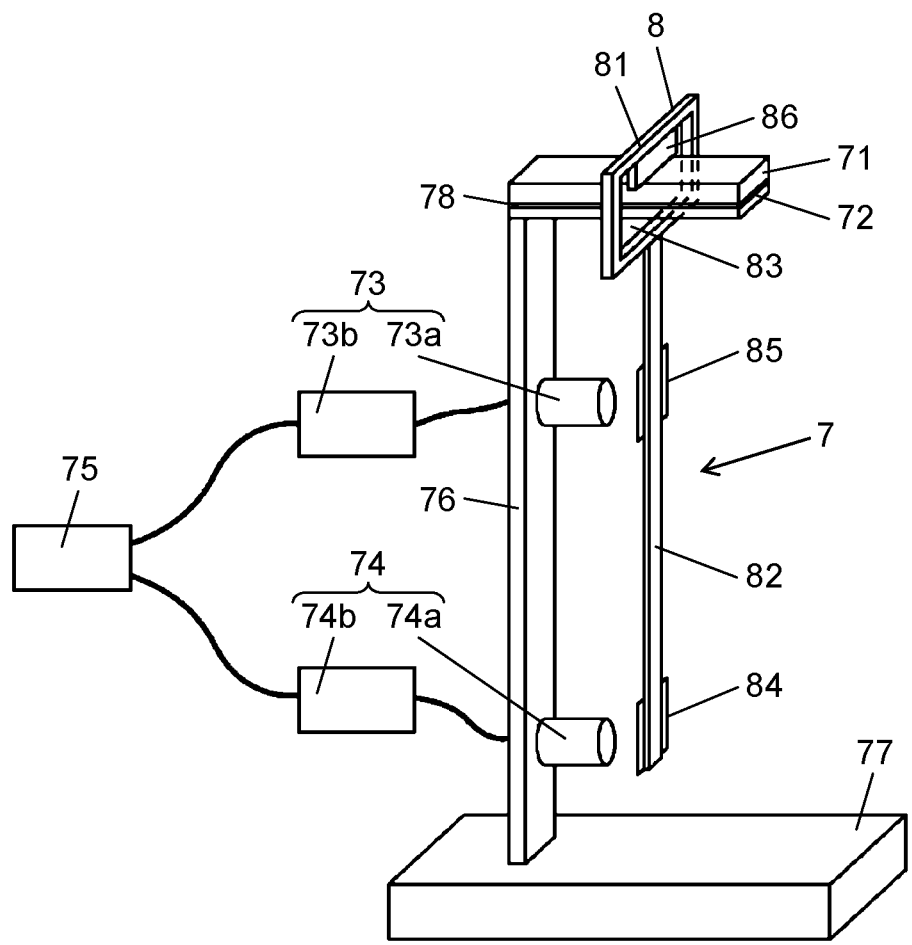
FIG. 3 is a schematic perspective view showing an example of a rigid body pendulum type viscoelasticity measuring device in the exemplary embodiment.

FIG. 3 is a schematic perspective view showing an example of rigid body pendulum type viscoelasticity measuring device 7 in the exemplary embodiment. Rigid body pendulum type viscoelasticity measuring device 7 is a so-called pendulum type viscoelasticity measuring device.

Figure 4A:
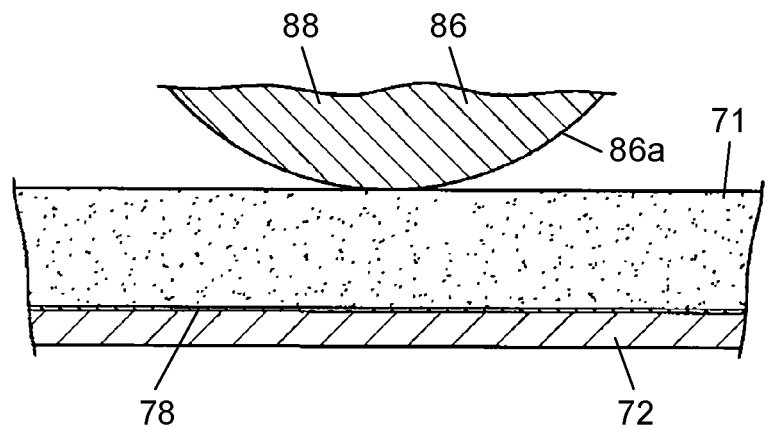
FIG. 4A is a schematic enlarged cross-sectional view showing an example of a fulcrum part of a pendulum in the exemplary embodiment.
Figure 4B:
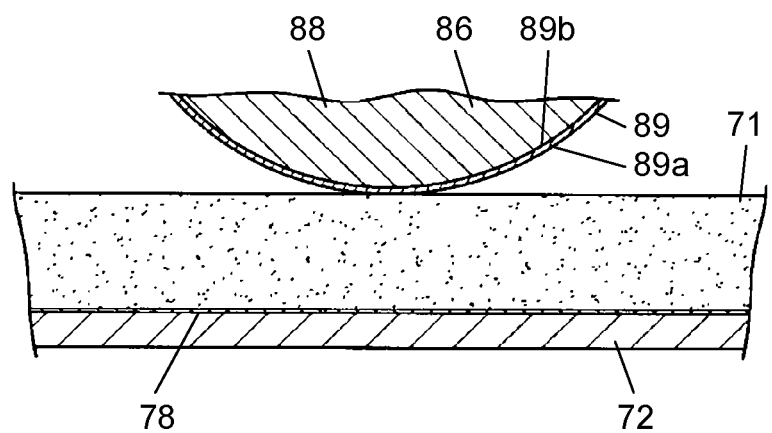
FIG. 4B is a schematic enlarged cross-sectional view showing another example of the fulcrum part of the pendulum in the exemplary embodiment.

FIG. 4A is a schematic enlarged cross-sectional view showing an example of fulcrum part 86 of a pendulum 8 (see FIG. 3) in the exemplary embodiment. FIG. 4B is a schematic enlarged cross-sectional view showing another example of fulcrum part 86 of pendulum 8 in the exemplary embodiment. As shown in FIG. 4A and FIG. 4B, the measurement using rigid body pendulum type viscoelasticity measuring device 7 is performed on the basis of a motion characteristic of pendulum 8 when pendulum 8 is made to oscillate with fulcrum part 86 of pendulum 8 being in contact with sample 71. From the motion characteristic of pendulum 8, the viscoelasticity of sample 71 is measured. In the measurement using rigid body pendulum type viscoelasticity measuring device 7, the motion characteristic of pendulum 8 can be obtained by pendulum 8 being in contact with sample 71 and freely oscillating. In the case where the measurement using rigid body pendulum type viscoelasticity measuring device 7 is performed in manufacturing metal clad laminated board 1, liquid crystal polymer film 3 is used as sample 71. In the case of manufacturing electronic circuit board 2, at least each of first liquid crystal polymer film 31 and second liquid crystal polymer film 32 is used as sample 71. Third liquid crystal polymer film 33 can be used as sample 71.

As shown in FIG. 3, rigid body pendulum type viscoelasticity measuring device 7 includes sample table 72, pendulum 8, oscillating device 74, and displacement measurement device 73.

Sample table 72 is horizontally provided from an upper end of support post 76. Support post 76 is vertically provided on base 77. Sample 71 is to be placed on an upper side of sample table 72. Sample table 72 is provided with heating device 78 to heat sample 71 at the time of measuring the viscoelasticity.

Pendulum 8 has frame 81, leg 82, and fulcrum part 86 as shown in FIG. 3. Frame 81 is formed in a rectangular shape with four sides and has opening 83. Fulcrum part 86 is provided on a lower part of the upper side of frame 81. Fulcrum part 86 is a part including a fulcrum point about which pendulum 8 oscillates. Leg 82 is provided downwardly from a central part of the lower side of frame 81. A length of leg 82 is shorter than a length of support post 76. Oscillation piece 84 is provided on a lower end of leg 82. Oscillation piece 84 is made of, for example, magnetic material. On leg 82, displacement piece 85 is provided between the lower side of frame 81 and oscillation piece 84.

Displacement piece 85 is a reference for measuring a displacement of pendulum 8. As shown in FIG. 3, sample table 72 on which sample 71 is placed is inserted in opening 83 of pendulum 8, and fulcrum part 86 of pendulum 8 is placed on sample 71. Fulcrum part 86 is brought into contact with sample 71. In this state, it is possible to make pendulum 8 freely oscillate with fulcrum part 86 as the fulcrum point.

Fulcrum part 86 of pendulum 8 is a rod having a cylindrical shape as shown in FIG. 4A and FIG. 4B. Hereinafter, two examples shown in FIG. 4A and FIG. 4B will be separately described.

Fulcrum part 86 shown in FIG. 4A will be described. With reference to FIG. 4A, fulcrum part 86 is rod 88 having a cylindrical shape and made of metal. Surface 86a of fulcrum part 86 is roughened. A material of the metal constituting fulcrum part 86 is preferably the same as the material of the metal constituting metal foil 4 used to manufacture metal clad laminated board 1. For example, if a copper foil is used to manufacture metal clad laminated board 1, fulcrum part 86 is preferably a rod having a cylindrical shape and made of copper. A condition of roughness of surface 86a of fulcrum part 86 is preferably the same as the condition of roughness of the surface, of metal foil 4 used to actually manufacture metal clad laminated board 1, to be stacked on liquid crystal polymer film 3. If the same material and the same condition of roughness are used, it is possible to reproduce how liquid crystal polymer film 3 and metal foil 4 are blending into each other when metal clad laminated board 1 is actually manufactured. Thus, by using as a reference the melting start temperature of liquid crystal polymer film 3 at that time, the most appropriated manufacturing condition can be set.

Fulcrum part 86 shown in FIG. 4B will be described. With reference to FIG. 4B, fulcrum part 86 is rod 88 having a cylindrical shape, and metal foil 89 is attached to an outer surface of rod 88. A material of rod 88 may be metal or may not be metal. Metal foil 89 is attached to rod 88 such that roughened surface 89a faces outside. Roughened surface 89a is one surface of metal foil 89, and surface 89b of metal foil 89 on the other side is in close contact with an outer surface of rod 88. Surface 89b may be roughened or may not be roughened. Metal foil 89 is preferably the same as metal foil 4 to be used to manufacture metal clad laminated board 1. For example, if a copper foil is used to manufacture metal clad laminated board 1, it is preferable that metal foil 89 be the same copper foil. In addition, the condition of roughness of the surface of metal foil 89 is preferably the same as the condition of roughness of the surface, of metal foil 4 used to actually manufacture metal clad laminated board 1, to be stacked on liquid crystal polymer film 3. Specifically, metal foils having the same surface roughness may be used, or metal foils of the same manufacturer and of the same product number may be used. If the same material and the same condition of roughness are used, it is possible to reproduce how liquid crystal polymer film 3 and metal foil 4 are blending into each other when metal clad laminated board 1 is actually manufactured. Thus, by using as a reference the melting start temperature of liquid crystal polymer film 3 at that time, the most appropriated manufacturing condition can be set.

The items common to fulcrum parts 86 shown in FIG. 4A and FIG. 4B will be described below. Entire fulcrum part 86 does not need to have a cylinder shape, and a cross-section of a surface of fulcrum part 86 that comes in contact with sample 71 only has to have a circular arc-shape. A radius of curvature R of the circular arc-shaped cross-section is preferably equal to or greater than 0.5 mm. In this case, fulcrum part 86 is not too thin, and it is possible to make fulcrum part 86 less likely to cut sample 71 at the time of the measurement of viscoelasticity. An upper limit of the radius of curvature R of the circular arc-shaped cross-section is not particularly limited but is preferably substantially not greater than 10.0 mm. In this case, a cycle of the oscillation of pendulum 8 is not too long, and it is possible to make a measurement time of the viscoelasticity less likely to be long. It is also possible to prevent or reduce breakage of sample 71. The surface of fulcrum part 86 that comes in contact with sample 71 means a surface that comes in contact with sample 71 when pendulum 8 oscillates. Therefore, a surface of fulcrum part 86 that does not come in contact with sample 71 even when pendulum 8 oscillates does not have to have a circular arc-shape. While a contact point at which fulcrum part 86 and sample 71 are being in contact with each other is functioning as a fulcrum point, pendulum 8 oscillates. Fulcrum part 86 is placed on sample 71 so as to be able to roll in the direction of the oscillation of pendulum 8. That is, assuming the oscillation direction of pendulum 8 as the lateral direction, when pendulum 8 swings leftward, fulcrum part 86 rolls rightward on sample 71, and when pendulum 8 swings rightward, fulcrum part 86 rolls leftward on sample 71.

Oscillating device 74 is configured to apply oscillation to pendulum 8. For example, oscillating device 74 has electromagnet 74a and power supply 74b as shown in FIG. 3. On support post 76, electromagnet 74a is provided at a position at which electromagnet 74a faces oscillation piece 84 when pendulum 8 is in a resting state. Power supply 74b is electrically connected to electromagnet 74a and controller 75. Controller 75 controls energization to electromagnet 74a from power supply 74b. When electromagnet 74a is energized to attract oscillation piece 84 toward electromagnet 74a and then the energization is stopped, oscillation can be applied to pendulum 8.

Displacement measurement device 73 is configured to measure a displacement of pendulum 8. Displacement measurement device 73 has displacement sensor 73a and displacement meter 73b as shown in FIG. 3. On support post 76, displacement sensor 73a is provided at a position at which displacement sensor 73a faces displacement piece 85 when pendulum 8 is in a resting state. The displacement of displacement piece 85 can be detected by displacement sensor 73a. Displacement meter 73b is electrically connected to displacement sensor 73a and controller 75. On the basis of a detection result of displacement sensor 73a, the displacement of pendulum 8 can be measured by displacement meter 73b. FIG. 5 is a diagram showing an example of a damping curve of the oscillation of pendulum 8 in the exemplary embodiment. On the basis of the measurement result as shown in FIG. 5 and Equation (1) and Equation (2), controller 75 can calculate a damping rate (logarithmic damping rate) of an amplitude and an oscillation cycle depending on the above specified temperature. Further, controller 75 can analyze the viscoelasticity of sample 71 at the specified temperature.

[Mathematical Expression 1]

Logarithmic damping rate: $\Delta$ $$\Delta = \{\ln(A_1/A_2) + \ln(A_2/A_3) + \ldots + \ln(A_n + A_{n+1})\}/n \quad \text{Equation (1)}$$

where n is a wave number.

[Mathematical Expression 2]

Oscillating period: T[s]

$$T = (P_1 + P_2 + \ldots + P_n)/n \quad \text{Equation (2)}$$

where n is a wave number.

By using rigid body pendulum type viscoelasticity measuring device 7 of the present exemplary embodiment, the viscoelasticity of sample 71 is measured as describe below. Sample 71 is placed on the upper surface of sample table 72. Fulcrum part 86 of pendulum 8 is placed on the upper surface of sample 71, and fulcrum part 86 thus comes into contact with sample 71.

Sample 71 is softened by being heated at the specified temperature by heating device 78, and a free oscillation cycle and the amplitude of pendulum 8 are measured.

To measure the free oscillation cycle and the amplitude of pendulum 8, displacement measurement device 73 can be used. In the case where pendulum 8 is in a resting state or in the case where pendulum 8 is oscillating but the amplitude is smaller than a measurement limit of displacement measurement device 73, oscillating device 74 can be operated so that the oscillation of pendulum 8 can be obtained through displacement measurement device 73.

FIG. 6 is a graph showing an example of how the melting start temperature is calculated from the logarithmic damping rate of the liquid crystal polymer film in the exemplary embodiment. As shown in FIG. 6, sample 71 is heated up from 250° C. in steps of 1° C. by heating device 78. The logarithmic damping rate of sample 71 is measured at each temperature by using rigid body pendulum type viscoelasticity measuring device 7. In the relation between the temperature and the logarithmic damping rate, the temperature at which a gradient of the logarithmic damping rate changes is the melting start temperature of sample 71. In the example of FIG. 6, since the gradient based on the relation between the temperature and the logarithmic damping rate changes across the temperature of 350° C., 350° C. is the melting start temperature of sample 71.

In the present exemplary embodiment, liquid crystal polymer film 3, specifically, first liquid crystal polymer film 31, second liquid crystal polymer film 32, and third liquid crystal polymer film 33 are used as sample 71. By using rigid body pendulum type viscoelasticity measuring device 7, it is possible to previously measure the viscoelasticity and the melting start temperature of sample 71 at the heating temperature in the process of manufacturing metal clad laminated board 1 and electronic circuit board 2. Even when the viscoelasticity and the melting start temperature of sample 71 is difficult to measure by a conventional pendulum type viscoelasticity measuring device, it is possible to measure those by using rigid body pendulum type viscoelasticity measuring device 7 of the present exemplary embodiment. When rigid body pendulum type viscoelasticity measuring device 7 of the present exemplary embodiment is used, the melting start temperature of sample 71 in the state of a thin film can be measured. The thus obtained melting start temperature can be confirmed as a more practical temperature than the melting start temperature obtained by the DSC or other methods.

By using rigid body pendulum type viscoelasticity measuring device 7, it is possible to previously grasp the melting start temperature of sample 71 that is related to the material for metal clad laminated board 1 and electronic circuit board 2 and whose outermost layer is removed. That is, it is possible to previously measure the physical properties of sample 71 whose outermost layer is removed, before metal clad laminated board 1 and electronic circuit board 7 are manufactured as final products. In this step, if a predetermined standard value of the melting start temperature is set, it is possible to screen appropriateness for metal clad laminated board 1 and electronic circuit board 2 of liquid crystal polymer film 3 on the basis of the physical properties. In some cases, the previously measured physical properties of sample 71 are found so as not to be appropriate for manufacturing metal clad laminated board 1 and electronic circuit board 2. In that case, the outermost layer of liquid crystal polymer film 3 is preferably removed again such that the melting start temperature becomes a predetermined value. Thus, the melting start temperature of liquid crystal polymer film 3 can be made close to the predetermined standard value appropriate for manufacturing metal clad laminated board 1 and electronic circuit board 2.

As described above, a method for manufacturing metal clad laminated board 1 according to the present exemplary embodiment includes: a step of removing an outermost layer or outermost layers on one side or both sides of liquid crystal polymer film 3; and a molding step of performing thermo-compression molding on liquid crystal polymer film 3 and metal foil 4 stacked on a side of liquid crystal polymer film 3 whose outermost layer is removed. A heating temperature in the molding step is in a range from a temperature equal to a melting start temperature, of liquid crystal polymer film 3, measured by using rigid body pendulum type viscoelasticity measuring device 7 to a temperature 60° C. higher than the melting start temperature inclusive.

Thus, also in the case where liquid crystal polymer film 3 is used in metal clad laminated board 1, it is possible to improve adhesiveness between liquid crystal polymer film 3 and metal foil 4. Specifically, it is possible to improve solder heat resistance of metal clad laminated board 1 and peel strength of metal foil 4. In particular, even in the case of metal clad laminated board 1 where surface roughness Rz of metal foil 4 to be stacked on liquid crystal polymer film 3 has low roughness, for example, 1.5 µm or lower, it is possible to improve adhesiveness.

In the step of removing the outermost layer or the outermost layers on one side or both sides of liquid crystal polymer film 3, it is preferable to remove the outermost layer of liquid crystal polymer film 3 by between 0.1 µm and 1.0 µm inclusive.

In the step of removing the outermost layer or the outermost layers on one side or both sides of liquid crystal polymer film 3, it is preferable to remove, by polishing, the outermost layer or the outermost layers on the one side or the both sides of liquid crystal polymer film 3.

The heating temperature in the molding step is preferably between 250° C. and 350° C. inclusive.

The maximum heating temperature in the molding step is preferably in a range from the temperature 5° C. lower than the melting point of liquid crystal polymer film 3 to the temperature 20° C. higher than the melting point of liquid crystal polymer film 3 inclusive.

The measurement using rigid body pendulum type viscoelasticity measuring device 7 is performed on the basis of a motion characteristic of pendulum 8 when pendulum 8 is made to oscillate with fulcrum part 86 of pendulum 8 being in contact with liquid crystal polymer film 3 as sample 71. Fulcrum part 86 of pendulum 8 is rod 88 having a cylindrical shape, and metal foil 4 is attached to an outer surface of rod 88, where metal foil 4 is preferably attached to rod 88 such that the roughened surface faces outside.

It is preferable that the difference between the measurement values of the melting start temperatures obtained from the both sides of liquid crystal polymer film 8 be not greater than 10° C. when the outermost layers on the both sides of liquid crystal polymer film 3 are removed in the step of removing the outermost layer 3.

A method for manufacturing electronic circuit board 2 of the present exemplary embodiment includes: a step of preparing core material 6 having conductor circuit 41 formed on one side of core material 6; a step of preparing single-sided metal clad laminated board 11 configured with first liquid crystal polymer film 31 and metal foil 4 attached to one side of first liquid crystal polymer film 31; a step of preparing bonding sheet 5 configured with second liquid crystal polymer film 32; a step of removing outermost layers on both sides of second liquid crystal polymer film 32; a step of forming stacked article 13 by stacking, in order, core material 6, bonding sheet 5, and single-sided metal clad laminated board 11 in a manner that a side of core material 6 that conductor circuit 41 is formed on and one side of bonding sheet 5 are opposed to each other and that another side of bonding sheet 5 and a side of first liquid crystal polymer film 31 of single-sided metal clad laminated board 11 are opposed to each other; and a step of performing thermocompression molding on stacked article 13. A heating temperature in the step of performing thermocompression molding on stacked article 13 is in a range from a temperature equal to a melting start temperature, of second liquid crystal polymer film 32, measured by using rigid body pendulum type viscoelasticity measuring device 7 to a temperature 60° C. higher than the melting start temperature inclusive.

Thus, also in the case where liquid crystal polymer film 3 is used in electronic circuit board 2, it is possible to improve adhesiveness between liquid crystal polymer film 3 and metal foil 4 and adhesiveness between liquid crystal polymer film 3 and conductor circuit 41. Specifically, it is possible to improve solder heat resistance of electronic circuit board 2 and peel strength of metal foil 4. In particular, even in the case of electronic circuit board 2 where surface roughness Rz of conductor circuit 41 of core material 6 to be stacked on bonding sheet 5 has low roughness, for example, 1.5 µm or lower, it is possible to improve adhesiveness.

In the step of removing the outermost layers on the both sides of second liquid crystal polymer film 32, it is preferable to remove the outermost layers on the both sides of second liquid crystal polymer film 32 by between 0.1 µm and 1.0 µm inclusive.

In the step of removing the outermost layers on the both sides of second liquid crystal polymer film 32, it is preferable to remove, by polishing, the outermost layers on the both sides of liquid second liquid crystal polymer film 32.

The heating temperature in the step of performing thermocompression molding on stacked article 13 is preferably between 250° C. and 350° C. inclusive.

The maximum heating temperature in the step of performing thermocompression molding on the stacked article is preferably in a range from the temperature 5° C. lower than the melting point of second liquid crystal polymer film 32 to the temperature 20° C. higher than the melting point of second liquid crystal polymer film 32 inclusive.

The measurement using rigid body pendulum type viscoelasticity measuring device 7 is performed on the basis of a motion characteristic of pendulum 8 when pendulum 8 is made to oscillate with fulcrum part 86 of pendulum 8 being in contact with second liquid crystal polymer film 32 as sample 71. Fulcrum part 86 of pendulum 8 is rod 88 having a cylindrical shape, and metal foil 4 is attached to an outer surface of rod 88, where metal foil 4 is preferably attached to rod 88 such that the roughened surface faces outside.

It is preferable that the difference between the measurement values of the melting start temperatures obtained from the both sides of second liquid crystal polymer film 32 be equal to or smaller than 10° C.

Further, rigid body pendulum type viscoelasticity measuring device 7 of the present exemplary embodiment is a viscoelasticity measurement device that measures viscoelasticity of sample 71, and rigid body pendulum type viscoelasticity measuring device 7 includes sample table 72 that sample 71 is placed on; pendulum 8 that has fulcrum part 86 being in contact with sample 71 and freely oscillates with fulcrum part 86 as a fulcrum point; oscillating device 74 that applies oscillation to pendulum 8; and displacement measurement device 73 that measures a displacement of pendulum 8. Fulcrum part 86 is rod 88 having a cylindrical shape and made of metal, and the surface of fulcrum part 86 is roughened.

Further, rigid body pendulum type viscoelasticity measuring device 7 of the present exemplary embodiment is a viscoelasticity measurement device that measures viscoelasticity of sample 71, and rigid body pendulum type viscoelasticity measuring device 7 includes sample table 72 that sample 71 is placed on; pendulum 8 that has fulcrum part 86 being in contact with sample 71 and freely oscillates with fulcrum part 86 as a fulcrum point; oscillating device 74 that applies oscillation to pendulum 8; and displacement measurement device 73 that measures a displacement of pendulum 8. Fulcrum part 86 is rod 88 having a cylindrical shape, and metal foil 4 is attached to an outer surface of rod 88. Metal foil 4 is attached to rod 88 such that the roughened surface faces outside.

EXAMPLES

Hereinafter, examples of the present invention will be described.

Example 1

As liquid crystal polymer film 3 of double-sided metal clad laminated board 12, VECSTAR CT-Z manufactured by Kuraray Co., Ltd. (thickness: 25 μm, melting point measured by DSC: 335° C.) was prepared.

As metal foils 4, a copper foil (F2WS manufactured by Furukawa Electric Co., Ltd., thickness: 12 μm) was prepared.

The liquid crystal polymer layers as the outermost layers on the upper side and the lower side of liquid crystal polymer film 3 were removed by a polishing roll by 0.4 μm.

Liquid crystal polymer film 3 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of liquid crystal polymer film 3 and the logarithmic damping rate at 250° C. were measured. As a result, the melting start temperature of the upper side was 320° C. The melting start temperature of the lower side was 325° C. The logarithmic damping rate at 250° C. was 0.08.

By using liquid crystal polymer film 3 whose outermost layers on the upper side and the lower side were removed and metal foil 4, double-sided metal clad laminated board 12 was manufactured in the manner as describe below.

Metal foils 4 were stacked on the both sides of liquid crystal polymer film 3 whose outermost layers were removed. In this step, the sides, of metal foils 4, stacked on liquid crystal polymer film 3 were matte surfaces. Thus stacked liquid crystal polymer film 3 and metal foils 4 were subjected to thermocompression molding under the molding conditions of 340° C., 4 MPa, and 5 minutes, and double-sided metal clad laminated board 12 as shown in FIG. 1B was obtained.

Example 2

Liquid crystal polymer film 3 and metal foils 4 identical to those in Example 1 were prepared.

The liquid crystal polymer layers as the outermost layers on the upper side and the lower side of liquid crystal polymer film 3 were removed by a polishing roll by 0.4 μm.

Liquid crystal polymer film 3 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of liquid crystal polymer film 3 and the logarithmic damping rate at 250° C. were measured. As a result, the melting start temperature of the upper side was 325° C. The melting start temperature of the lower side was 340° C. The logarithmic damping rate at 250° C. was 0.08. Note that, the melting start temperatures for the both sides of liquid crystal polymer film 3 before polishing and the logarithmic damping rate at 250° C. were the same as those in Example 1.

By using liquid crystal polymer film 3 which was obtained in the above manner and in which the outermost layers on the both sides were removed, double-sided metal clad laminated board 12 was manufactured in the same manner as in Example 1.

Example 3

Liquid crystal polymer film 3 and metal foils 4 identical to those in Example 1 were prepared.

The liquid crystal polymer layers as the outermost layers on the upper side and the lower side of liquid crystal polymer film 3 were removed by a polishing roll by 0.4 μm.

Liquid crystal polymer film 3 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of liquid crystal polymer film 3 and the logarithmic damping rate at 250° C. were measured. As a result, the melting start temperatures of the upper side and the lower side were 330° C. The logarithmic damping rate at 250° C. was 0.09. Note that, the melting start temperatures for the both sides of liquid crystal polymer film 3 before polishing and the logarithmic damping rate at 250° C. were the same as those in Example 1.

Metal foil 4 was stacked on one side of liquid crystal polymer film 3 which was obtained in the above manner and in which the outermost layers on the both sides were removed. In this step, the side, of metal foil 4, stacked on liquid crystal polymer film 3 was a matte surface. Liquid crystal polymer film 3 and metal foil 4 stacked as described above were subjected to thermocompression molding under the molding conditions of 340° C., 4 MPa, and 5 minutes, and single-sided metal clad laminated board 11 as shown in FIG. 1A was obtained. Liquid crystal polymer film 3 of single-sided metal clad laminated board 11 was to function as first liquid crystal polymer film 31.

Next, as second liquid crystal polymer film 32 of bonding sheet 5, VECSTAR CT-F manufactured by Kuraray Co., Ltd. (thickness: 50 μm, melting point measured by DSC: 280° C.) was prepared.

The liquid crystal polymer layers as the outermost layers on the upper side and the lower side of bonding sheet 5 (second liquid crystal polymer film 32) were removed by a polishing roll by 0.4 μm.

Bonding sheet 5 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of second liquid crystal polymer film 32 and the logarithmic damping rate at 250° C. were measured. As a result, the melting start temperature of the upper side was 290° C. The melting start temperature of the lower side was 280° C. The logarithmic damping rate at 250° C. was 0.08.

By using double-sided metal clad laminated board 12 of Example 1 and removing unnecessary parts of metal foil 4 on one side, core material 6 on which conductor circuit 41 was formed was prepared. Liquid crystal polymer film 3 of core material 6 was to function as third liquid crystal polymer film 33.

By using above single-sided metal clad laminated board 11, bonding sheet 5, and core material 6, electronic circuit board 2 was manufactured as described below.

As shown in FIG. 2A, single-sided metal clad laminated board 11, bonding sheet 5, and core material 6 were stacked in this order. In this step, first liquid crystal polymer film 31 of single-sided metal clad laminated board 11 was stacked on one side of second liquid crystal polymer film 32 constituting bonding sheet 5. The surface of core material 6 on which conductor circuit 41 was provided (the surface included rough surface 6a) was stacked on the other side of bonding sheet 5. The thus stacked article was subjected to thermocompression molding under the molding conditions of 300° C., 1 MPa, and 90 minutes, and electronic circuit board 2 as shown in FIG. 2B was obtained. In electronic circuit board 2, first liquid crystal polymer film 31, second liquid crystal polymer film 32, and third liquid crystal polymer film 33 constitute insulating layer 300. With this arrangement, electronic circuit board 2 has an excellent high frequency characteristic.

Example 4

Liquid crystal polymer film 3 and metal foils 4 identical to those in Example 1 were prepared.

The liquid crystal polymer layers as the outermost layers on the upper side and the lower side of liquid crystal polymer film 3 were removed by a polishing roll by 0.4 μm.

Liquid crystal polymer film 3 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of liquid crystal polymer film 3 and the logarithmic damping rate at 250° C. were measured. As a result, the melting start temperature of the upper side was 325° C. The melting start temperature of the lower side was 320° C. The logarithmic damping rate at 250° C. was 0.08. Note that, the melting start temperatures for the both sides of liquid crystal polymer film 3 before polishing and the logarithmic damping rate at 250° C. were the same as those in Example 1.

By using liquid crystal polymer film 3 which was obtained in the above manner and in which the outermost layers on the both sides were removed, single-sided metal clad laminated board 11 was manufactured in the same manner as in Example 3. Liquid crystal polymer film 3 of single-sided metal clad laminated board 11 was to function as first liquid crystal polymer film 31.

Next, as second liquid crystal polymer film 32 of bonding sheet 5, VECSTAR CTF manufactured by Kuraray Co., Ltd. (which was the same liquid crystal polymer film as that in Example 3) was prepared.

The liquid crystal polymer layers as the outermost layers on the upper side and the lower side of bonding sheet 5 (second liquid crystal polymer film 32) were removed by a polishing roll by 0.4 μm.

Bonding sheet 5 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures for the upper side and the lower side of second liquid crystal polymer film 32 and the logarithmic damping rate at 250° C. were measured. As a result, the melting start temperature of the upper side was 280° C. The melting start temperature of the lower side was 295° C. The logarithmic damping rate at 250° C. was 0.09.

By using double-sided metal clad laminated board 12 of Example 1 and removing unnecessary parts of metal foil 4 on one side, core material 6 on which conductor circuit 41 was formed was prepared.

By using above single-sided metal clad laminated board 11, bonding sheet 5, and core material 6, electronic circuit board 2 was manufactured in the same manner as in Example 3.

Example 5

As liquid crystal polymer film 3, VECSTAR CT-Q manufactured by Kuraray Co., Ltd. (thickness: 25 μm, melting point measured by DSC: 310° C.) was prepared.

As metal foils 4, the same copper foil as in Example 1 (F2WS manufactured by Furukawa Electric Co., Ltd., thickness: 12 μm) was prepared.

The liquid crystal polymer layers as the outermost layers on the upper side and the lower side of liquid crystal polymer film 3 were removed by a polishing roll by 0.4 μm.

Liquid crystal polymer film 3 whose liquid crystal polymer layers as the outermost layers on the upper side and the lower side were removed was set as sample 71 on rigid body pendulum type viscoelasticity measuring device 7. By using rigid body pendulum type viscoelasticity measuring device 7, the melting start temperatures were measured for the upper side and the lower side of liquid crystal polymer film 3. As a result, the melting start temperature of the upper side was 260° C. The melting start temperature of the lower side was 270° C.

By using liquid crystal polymer film 3 whose outermost layers on the upper side and the lower side were removed and metal foil 4, double-sided metal clad laminated board 12 was manufactured in the manner as describe below.

Metal foils 4 were stacked on the both sides of liquid crystal polymer film 3 whose outermost layers were removed. In this step, the sides, of metal foils 4, stacked on liquid crystal polymer film 3 were a matte surface. Thus stacked liquid crystal polymer film 3 and metal foils 4 were subjected to thermocompression molding under the molding conditions of 320° C., 4 MPa, and 5 minutes, and double-sided metal clad laminated board 12 as shown in FIG. 1B was obtained.

Comparative Example 1

Liquid crystal polymer film 3 and metal foils 4 identical to those in Example 1 were prepared. Liquid crystal polymer film 3 at this stage was not subjected to a process of removing the liquid crystal polymer layer as the outermost layer.

By using liquid crystal polymer film 3 that was not subjected to the process of removing the liquid crystal polymer layer as the outermost layer, double-sided metal clad laminated board 12 was manufactured in the same manner as in Example 1.

Comparative Example 2

Liquid crystal polymer film 3 and metal foils 4 identical to those in Example 1 were prepared. Liquid crystal polymer film 3 at this stage was not subjected to a process of removing the liquid crystal polymer layer as the outermost layer.

By using liquid crystal polymer film 3 that was not subjected to the process of removing the liquid crystal polymer layer as the outermost layer, single-sided metal clad laminated board 11 was manufactured in the same manner as in Example 3.

As second liquid crystal polymer film 32 of bonding sheet 5, VECSTAR CT-F manufactured by Kuraray Co., Ltd.

(which was the same liquid crystal polymer film as the liquid crystal polymer film in Example 3) was prepared. Bonding sheet 5 at this stage was not subjected to the process of removing the liquid crystal polymer layer as the outermost layer.

Next, by using double-sided metal clad laminated board 12 of Example 1 and removing unnecessary parts of metal foil 4 on one side, core material 6 on which conductor circuit 41 was formed was prepared.

By using above single-sided metal clad laminated board 11, bonding sheet 5 that was not subjected to the process of removing the liquid crystal polymer layer as the outermost layer, and core material 6, electronic circuit board 2 was manufactured in the same manner as in Example 3.

Comparative Example 3

Double-sided metal clad laminated board 12 was manufactured in the same manner as in Example 1 except that the heating temperature in the molding step was changed.

Comparative Example 4

Electronic circuit board 2 was manufactured in the same manner as in Example 3 except that the heating temperature in the molding step was changed.

Comparative Example 5

Liquid crystal polymer film 3 and metal foils 4 identical to those in Example 5 were prepared. Liquid crystal polymer film 3 at this stage was not subjected to a process of removing the liquid crystal polymer layer as the outermost layer.

By using liquid crystal polymer film 3 that was not subjected to the process of removing the liquid crystal polymer layer as the outermost layer, double-sided metal clad laminated board 12 was manufactured in the same manner as in Example 1.

(Measurement Using Rigid Body Pendulum Type Viscoelasticity Measuring Device)

Rigid body pendulum type viscoelasticity measuring device 7 shown in FIG. 3 was prepared. As shown in FIG. 4B, fulcrum part 86 of pendulum 8 of rigid body pendulum type viscoelasticity measuring device 7 is rod 88 having a cylindrical shape, and metal foil 89 is attached to the outer surface of rod 88. Metal foil 89 is a copper foil (F2WS manufactured by Furukawa Electric Co., Ltd., thickness: 12 μm). Metal foil 89 is attached to rod 88 such that roughened surface 89a (matte surface) faces outside. A radius of curvature R of the circular arc-shaped cross-section of fulcrum part 86 satisfies the expression R=1.0 mm. Further, fulcrum part 86 of pendulum 8 of rigid body pendulum type viscoelasticity measuring device 7 may be rod 88 having a cylindrical shape and made of metal as shown in FIG. 4A. The metal is copper. Surface 86a of rod 88 is roughened. The condition of roughness of surface 86a is the same as the condition of roughness of the matte surface of the copper foil (F2WS manufactured by Furukawa Electric Co., Ltd., thickness: 12 μm). A radius of curvature R of the circular arc-shaped cross-section of fulcrum part 86 satisfies the expression R=1.0 mm. Note that the same measurement result is obtained by the type shown in FIG. 4B and by the type shown in FIG. 4A.

By using rigid body pendulum type viscoelasticity measuring device 7 while sample 71 was being heated at 250° C., the motion characteristic of pendulum 8 shown in FIG. 5 was obtained. On the basis of this result of the motion characteristic and above Equations (1) and (2), the logarithmic damping rate of sample 71 at 250° C. can be obtained.

Sample 71 was heated up from 250° C. in steps of 1° C. by heating device 78. At every step of heating sample 71, the logarithmic damping rate of sample 71 was measured at each temperature by using rigid body pendulum type viscoelasticity measuring device 7. In the relation between the temperature and the logarithmic damping rate, the melting start temperature of sample 71 can be calculated from the temperature at which the gradient changes. The relation between the temperature and the logarithmic damping rate shown in FIG. 6 shows that the melting start temperature of sample 71 is 350° C. Each of liquid crystal polymer films 3 of Examples 1 to 4 and Comparative Examples 1 to 4 was uses as sample 71, and the melting start temperatures and the logarithmic damping rate of each liquid crystal polymer film 3 at 250° C. were measured in the above manner.

(Solder Heat Resistance Test)

Double-sided metal clad laminated boards 12 of Examples 1 and 2 and Comparative Examples 1 and 3, in addition, electronic circuit boards 2 of Examples 3 and 4 and Comparative Examples 2 and 4 were used as test pieces, and solder heat resistance tests were performed according to Japanese Industrial Standards Committee 6481 (JIS C 6481). The solder heat resistance tests were performed in a manner that a solder temperature was raised from 250° C. in steps of 10° C. In the step of raising the solder temperature, the test piece was left on solder for 60 seconds at each temperature. Then it was checked whether there was a blister or a separation between layers of the test piece. The maximum temperature of the solder at which neither blister nor separation between layers was found was recorded as an evaluation result.

Regarding a determination index for the solder heat resistance test, if the maximum solder temperature was in the range from equal to or higher than 320° C., it was labeled as good (GD), if in the range from equal to or higher than 300° C. to lower than 320° C., it was labeled as okay (OK), and if in the range lower than 300° C., it was labeled as no good (NG).

Table 1 shows the evaluation results of Examples 1 to 4 and Comparative Example 1 to 4.

TABLE 1

| | | | Example 1 | Example 2 | Example 3 | Example 4 | Example 5 |
|---|---|---|---|---|---|---|---|
| Configuration | | | FIG. 1B | FIG. 1B | FIG. 2B | FIG. 2B | FIG. 1B |
| Liquid crystal polymer film of | Product number | | KURARAY CO., LTD. CT-Z | KURARAY CO., LTD. CT-Z | KURARAY CO., LTD. CT-Z | KURARAY CO., LTD. CT-Z | KURARAY CO., LTD. CT-Q |
| | Polishing | | Done | Done | Done | Done | Done |

TABLE 1-continued

|  |  |  |  |  |  |  |
|---|---|---|---|---|---|---|
| metal clad laminated board | Thickness [μm] | 25 | 25 | 25 | 25 | 25 |
|  | Melting start temperature [° C.] measured by rigid body pendulum type viscoelasticity measuring device Upper surface of liquid crystal polymer film | 320 | 325 | 330 | 325 | 260 |
|  | Melting start temperature [° C.] measured by rigid body pendulum type viscoelasticity measuring device Lower surface of liquid crystal polymer film | 325 | 340 | 330 | 320 | 270 |
|  | Heating temperature [° C.] in molding step | 340 | 340 | 340 | 340 | 320 |
| Liquid crystal polymer film as bonding sheet | Product number | — | — | KURARAY CO., LTD. CT-F | KURARAY CO., LTD. CT-F | — |
|  | Polishing | — | — | Done | Done | — |
|  | Thickness [μm] | — | — | 50 | 50 | — |
|  | Melting start temperature [° C.] measured by rigid body pendulum type viscoelasticity measuring device Upper surface of liquid crystal polymer film | — | — | 290 | 280 | — |
|  | Melting start temperature [° C.] measured by rigid body pendulum type viscoelasticity measuring device Lower surface of liquid crystal polymer film | — | — | 280 | 295 | — |
|  | Heating temperature [° C.] in molding step | — | — | 300 | 300 | — |
| Evaluation result | Solder heat resistance temperature [° C.] | 330 | 310 | 330 | 310 | 330 |
|  | Determination result | GD | OK | GD | OK | GD |

|  |  | Comparative Example 1 | Comparative Example 2 | Comparative Example 3 | Comparative Example 4 | Comparative Example 5 |
|---|---|---|---|---|---|---|
| Configuration |  | FIG. 1B | FIG. 2B | FIG. 1B | FIG. 2B | FIG. 1B |
| Liquid crystal polymer film of metal clad laminated board | Product number | KURARAY CO., LTD. CT-Z | KURARAY CO., LTD. CT-Z | KURARAY CO., LTD. CT-Z | KURARAY CO., LTD. CT-Z | KURARAY CO., LTD. CT-Q |
|  | Polishing | Not done | Not done | Done | Done | Not done |
|  | Thickness [μm] | 25 | 25 | 25 | 25 | 25 |
|  | Melting start temperature [° C.] measured by rigid body pendulum type viscoelasticity measuring device Upper surface of liquid crystal polymer film | 345 | 345 | 325 | 325 | 270 |
|  | Melting start temperature [° C.] measured by rigid body pendulum type viscoelasticity measuring device Lower surface of liquid crystal polymer film | 340 | 340 | 330 | 320 | 280 |
|  | Heating temperature [° C.] in molding step | 340 | 340 | 320 | 320 | 270 |
| Liquid crystal polymer film as bonding sheet | Product number | — | KURARAY CO., LTD. CT-F | — | KURARAY CO., LTD. CT-F | — |
|  | Polishing | — | Not done | — | Done | — |
|  | Thickness [μm] | — | 50 | — | 50 | — |
|  | Melting start temperature [° C.] measured by rigid body pendulum type viscoelasticity measuring device Upper surface of liquid crystal polymer film | — | 310 | — | 290 | — |
|  | Melting start temperature [° C.] measured by rigid body pendulum type viscoelasticity measuring device Lower surface of liquid crystal polymer film | — | 315 | — | 280 | — |
|  | Heating temperature [° C.] in molding step | — | 300 | — | 280 | — |

TABLE 1-continued

| Evaluation result | Solder heat resistance temperature [° C.] | 260 | 260 | 260 | 260 | 260 |
|---|---|---|---|---|---|---|
| | Determination result | NG | NG | NG | NG | NG |

With the present invention, in the case of manufacturing a metal clad laminated board including a liquid crystal polymer film, it is possible to improve adhesiveness between the liquid crystal polymer film and a metal foil. Further, in the case of manufacturing an electronic circuit board including a liquid crystal polymer film, it is possible to improve adhesiveness between the liquid crystal polymer film and a conductor circuit. Therefore, the present invention is industrially useful as a method for manufacturing a metal clad laminated board and an electronic circuit board.

The invention claimed is:

1. A method for manufacturing a metal clad laminated board, the method comprising:
    removing at least one outermost layer on at least one side of a liquid crystal polymer film;
    preparing a first metal foil having a roughened surface;
    measuring a melting start temperature of the liquid crystal polymer film whose outermost layer is removed;
    performing thermocompression molding on the liquid crystal polymer film and the metal foil, the roughened surface of the first metal foil being stacked on the side of the liquid crystal polymer film whose outermost layer is removed,
    wherein the measuring of the melting start temperature of the liquid crystal polymer film comprises:
        measuring a logarithmic damping rate at each temperature near a melting point of the liquid crystal polymer film by using a rigid body pendulum type viscoelasticity measuring device; and
        calculating the melting start temperature from a temperature at which a gradient changes in a relation between the measured logarithmic damping rate and each corresponding temperature,
    a heating temperature in the performing is set in a range from a temperature equal to the melting start temperature of the liquid crystal polymer film to a temperature 60° C. higher than the melting start temperature inclusive,
    measurement using the rigid body pendulum type viscoelasticity measuring device is performed based on a motion characteristic of a pendulum when the pendulum is made to oscillate with a fulcrum part of the pendulum being in contact with the liquid crystal polymer film as a sample,
    the fulcrum part of the pendulum is a rod that has a cylindrical shape and an outer surface that is attached to a second metal foil,
    a material of the second metal foil is same as a material of the first metal foil and roughness of a surface of the second metal foil is same as a roughness of the first metal foil, and
    the second metal foil is attached to the rod with the surface of the second metal foil, which has the roughness, facing outside.

2. The method for manufacturing the metal clad laminated board according to claim 1, wherein, in the removing of the at least one outermost layer, the outermost layer of the liquid crystal polymer film is removed by between 0.1 μm and 1.0 μm inclusive.

3. The method for manufacturing the metal clad laminated board according to claim 1, wherein, in the removing of the at least one outermost layer, the outermost layer is removed by polishing.

4. The method for manufacturing the metal clad laminated board according to claim 1, wherein the heating temperature in the performing is between 250° C. and 350° C. inclusive.

5. The method for manufacturing the metal clad laminated board according to claim 1, wherein a maximum heating temperature in the performing is in a range from a temperature 5° C. lower than a melting point of the liquid crystal polymer film to a temperature 20° C. higher than the melting point of the liquid crystal polymer film inclusive.

6. The method for manufacturing the metal clad laminated board according to claim 1, wherein
    in the removing of the at least one outermost layer, outermost layers on both sides of the liquid crystal polymer film are removed, and
    a difference between measurement values of melting start temperatures obtained from the both sides of the liquid crystal polymer film is equal to or smaller than 10° C.

7. The method for manufacturing the metal clad laminated board according to claim 1, wherein
    the measuring of the melting start temperature further comprises:
        measuring the melting point of the liquid crystal polymer film by differential scanning calorimetry, at first.

8. The method for manufacturing the metal clad laminated board according to claim 1, wherein
    in the measuring of the logarithmic damping rate, the temperature is increased from 250° C. in steps of 1° C.

9. A method for manufacturing an electronic circuit board, the method comprising:
    preparing a core material having a conductor circuit formed on at least one side of the core material;
    preparing a single-sided metal clad laminated board configured with a first liquid crystal polymer film and a first metal foil attached to one side of the first liquid crystal polymer film, the first metal foil having a roughened surface;
    preparing a bonding sheet configured with a second liquid crystal polymer film;
    removing outermost layers on both sides of the second liquid crystal polymer film;
    measuring a melting start temperature of the second liquid crystal polymer film whose outermost layers are removed;
    forming a stacked article by stacking, in order, the core material, the bonding sheet, and the single-sided metal clad laminated board in a manner such that the side of the core material on which the conductor circuit is formed is opposed to one side of the bonding sheet and such that an other side of the bonding sheet is opposed to a side of the first liquid crystal polymer film of the single-sided metal clad laminated board; and
    performing thermocompression molding on the stacked article,
    wherein the measuring of the melting start temperature of the second liquid crystal polymer film comprises:

measuring a logarithmic damping rate at each temperature near a melting point of the second liquid crystal polymer film by using a rigid body pendulum type viscoelasticity measuring device; and calculating the melting start temperature from a temperature at which a gradient changes in a relation between the measured logarithmic damping rate and each corresponding temperature, a heating temperature in the performing thermocompression molding on the stacked article is set in a range from a temperature equal to the melting start temperature of the second liquid crystal polymer film to a temperature 60° C. higher than the melting start temperature inclusive, measurement using the rigid body pendulum type viscoelasticity measuring device is performed based on a motion characteristic of a pendulum when the pendulum is made to oscillate with a fulcrum part of the pendulum being in contact with the second liquid crystal polymer film as a sample, the fulcrum part of the pendulum is a rod that has a cylindrical shape and an outer surface that is attached to a second metal foil, a material of the second metal foil is same as a material of the first metal foil and roughness of a surface of the second metal foil is same as a roughness of the first metal foil, and the second metal foil is attached to the rod with the surface of the second metal foil, which has the roughness, facing outside.

10. The method for manufacturing the electronic circuit board according to claim 9, wherein, in removing the outermost layers on the both sides of the second liquid crystal polymer film, the outermost layers on the both sides of the second liquid crystal polymer film are removed by between 0.1 μm and 1.0 μm inclusive.

11. The method for manufacturing the electronic circuit board according to claim 9, wherein, in the removing the outermost layers on the both sides of the second liquid crystal polymer film, the outermost layers on the both sides of the second liquid crystal polymer film are removed by polishing.

12. The method for manufacturing the electronic circuit board according to claim 9, wherein, in the performing the thermocompression molding on the stacked article, the heating temperature is between 250° C. and 350° C. inclusive.

13. The method for manufacturing the electronic circuit board according to claim 9, wherein a maximum heating temperature in the performing the thermocompression molding on the stacked article is in a range from a temperature 5° C. lower than a melting point of the second liquid crystal polymer film to a temperature 20° C. higher than the melting point of the second liquid crystal polymer film inclusive.

14. The method for manufacturing the electronic circuit board according to claim 9, wherein a difference between measurement values, of the melting start temperatures, obtained from the both sides of the second liquid crystal polymer film is equal to or smaller than 10° C.

* * * * *